(12) United States Patent
En et al.

(10) Patent No.: US 7,456,062 B1
(45) Date of Patent: Nov. 25, 2008

(54) METHOD OF FORMING A SEMICONDUCTOR DEVICE

(75) Inventors: William G. En, Milpitas, CA (US); Thorsten Kammler, Ottendorf-Okrilla (DE); Eric N. Paton, Morgan Hill, CA (US); Paul R. Besser, Sunnyvale, CA (US); Simon Siu-Sing Chan, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 302 days.

(21) Appl. No.: 11/209,871

(22) Filed: Aug. 23, 2005

Related U.S. Application Data

(63) Continuation-in-part of application No. 10/969,774, filed on Oct. 20, 2004, now abandoned.

(51) Int. Cl.
*H01L 21/8238* (2006.01)
*H01L 21/336* (2006.01)
*H01L 21/3205* (2006.01)
*H01L 21/4763* (2006.01)

(52) U.S. Cl. .............. 438/231; 438/305; 438/586; 257/E21.148; 257/E21.151

(58) Field of Classification Search ............ 438/231, 438/233, 232, 226, 305, 306, 586, 589; 257/E21.148, 257/E21.151, E21.201, E21.43, E21.431, 257/E21.634, E21.64, E21.635, E21.432
See application file for complete search history.

(56) References Cited

U.S. PATENT DOCUMENTS

| 4,606,866 A | 8/1986 | McGlothlin |
|---|---|---|
| 4,868,617 A * | 9/1989 | Chiao et al. ............ 257/344 |
| 4,877,757 A | 10/1989 | York et al. |
| 4,933,295 A | 6/1990 | Feist |
| 5,091,763 A | 2/1992 | Sanchez |
| 5,180,464 A | 1/1993 | Tatsumi et al. |
| 5,298,454 A | 3/1994 | D'Asaro et al. |
| 5,319,232 A | 6/1994 | Pfiester |
| 5,387,309 A | 2/1995 | Bobel et al. |
| 5,556,462 A | 9/1996 | Celii et al. |
| 5,646,073 A | 7/1997 | Grider et al. |
| 5,670,018 A | 9/1997 | Eckstein et al. |
| 5,677,214 A | 10/1997 | Hsu |
| 5,696,012 A | 12/1997 | Son |
| 5,710,450 A | 1/1998 | Chau et al. |
| 5,773,328 A | 6/1998 | Blanchard |
| 5,854,136 A | 12/1998 | Huang et al. |
| 5,902,125 A | 5/1999 | Wu |

(Continued)

FOREIGN PATENT DOCUMENTS

JP 06326049 A 11/1994

OTHER PUBLICATIONS

Actions on the Merits by the U.S.P.T.O. as of Oct. 17, 2007, 6 pages.

(Continued)

*Primary Examiner*—Walter L Lindsay, Jr.

(57) ABSTRACT

A sidewall spacer structure is formed adjacent to a gate structure whereby a material forming an outer surface of the sidewall spacer structure contains nitrogen. Subsequent to its formation the sidewall spacer structure is annealed to harden the sidewall spacer structure from a subsequent cleaning process. An epitaxial layer is formed subsequent to the cleaning process.

21 Claims, 4 Drawing Sheets

U.S. PATENT DOCUMENTS

| | | | |
|---|---|---|---|
| 5,926,701 A | 7/1999 | Li | |
| 5,949,126 A | 9/1999 | Dawson et al. | |
| 5,953,609 A | 9/1999 | Koyama et al. | |
| 5,956,590 A | 9/1999 | Hsieh et al. | |
| 6,017,779 A | 1/2000 | Miyasaka | |
| 6,024,794 A | 2/2000 | Tamamura et al. | |
| 6,074,939 A | 6/2000 | Watanabe | |
| 6,077,076 A | 6/2000 | Comfort | |
| 6,124,610 A | 9/2000 | Cheek et al. | |
| 6,133,093 A | 10/2000 | Prinz et al. | |
| 6,143,036 A | 11/2000 | Comfort | |
| 6,159,422 A | 12/2000 | Graves et al. | |
| 6,165,826 A * | 12/2000 | Chau et al. | 438/231 |
| 6,165,857 A * | 12/2000 | Yeh et al. | 438/303 |
| 6,165,906 A | 12/2000 | Bandyopadhyay et al. | |
| 6,187,645 B1 | 2/2001 | Lin et al. | |
| 6,190,981 B1 | 2/2001 | Lin et al. | |
| 6,214,049 B1 | 4/2001 | Gayer et al. | |
| 6,228,730 B1 | 5/2001 | Chen et al. | |
| 6,228,746 B1 | 5/2001 | Ibok | |
| 6,235,568 B1 | 5/2001 | Murthy et al. | |
| 6,245,684 B1 | 6/2001 | Zhao et al. | |
| 6,251,764 B1 | 6/2001 | Pradeep et al. | |
| 6,255,152 B1 * | 7/2001 | Chen | 438/199 |
| 6,271,572 B1 | 8/2001 | Fujita | |
| 6,277,700 B1 | 8/2001 | Yu et al. | |
| 6,277,736 B1 | 8/2001 | Chen et al. | |
| 6,284,662 B1 | 9/2001 | Mikagi | |
| 6,294,432 B1 | 9/2001 | Lin et al. | |
| 6,303,447 B1 | 10/2001 | Chhagan et al. | |
| 6,313,017 B1 | 11/2001 | Varhue | |
| 6,316,302 B1 | 11/2001 | Cheek et al. | |
| 6,335,251 B2 | 1/2002 | Miyano et al. | |
| 6,346,447 B1 | 2/2002 | Rodder | |
| 6,346,468 B1 | 2/2002 | Pradeep et al. | |
| 6,346,505 B1 | 2/2002 | Morita et al. | |
| 6,348,387 B1 | 2/2002 | Yu | |
| 6,380,043 B1 | 4/2002 | Yu | |
| 6,383,877 B1 | 5/2002 | Ahn et al. | |
| 6,387,765 B2 | 5/2002 | Chhagan et al. | |
| 6,403,434 B1 | 6/2002 | Yu | |
| 6,436,841 B1 | 8/2002 | Tsai et al. | |
| 6,440,851 B1 | 8/2002 | Agnello et al. | |
| 6,444,578 B1 | 9/2002 | Cabral et al. | |
| 6,451,693 B1 | 9/2002 | Woo et al. | |
| 6,461,385 B1 | 10/2002 | Gayer et al. | |
| 6,472,283 B1 | 10/2002 | Ishida et al. | |
| 6,479,358 B1 | 11/2002 | Yu | |
| 6,596,138 B2 | 7/2003 | Shibasaki | |
| 6,673,637 B2 | 1/2004 | Wack et al. | |
| 6,677,233 B2 | 1/2004 | Dubin | |
| 6,679,946 B1 | 1/2004 | Jackson et al. | |
| 6,713,350 B2 | 3/2004 | Rudeck | |
| 6,726,767 B1 | 4/2004 | Marrs et al. | |
| 6,727,553 B2 | 4/2004 | Kotani | |
| 6,777,759 B1 | 8/2004 | Chau et al. | |
| 6,800,213 B2 | 10/2004 | Ding et al. | |
| 6,812,045 B1 | 11/2004 | Nikoonahad et al. | |
| 6,890,391 B2 | 5/2005 | Aoki et al. | |
| 6,908,822 B2 | 6/2005 | Rendon et al. | |
| 6,924,518 B2 | 8/2005 | Iinuma et al. | |
| 6,946,371 B2 | 9/2005 | Langdo et al. | |
| 6,979,622 B1 | 12/2005 | Thean et al. | |
| 7,008,835 B2 | 3/2006 | Jin et al. | |
| 7,014,788 B1 | 3/2006 | Fujimura et al. | |
| 7,018,891 B2 | 3/2006 | Doris et al. | |
| 7,037,793 B2 | 5/2006 | Chien et al. | |
| 7,176,522 B2 * | 2/2007 | Cheng et al. | 257/338 |
| 7,183,662 B2 | 2/2007 | Kim et al. | |
| 7,190,036 B2 | 3/2007 | Ko et al. | |
| 7,220,650 B2 | 5/2007 | Kao et al. | |
| 7,235,848 B2 | 6/2007 | Jeng | |
| 7,241,700 B1 | 7/2007 | En et al. | |
| 2001/0012693 A1 | 8/2001 | Talwar et al. | |
| 2002/0063084 A1 | 5/2002 | Lin et al. | |
| 2002/0104846 A1 | 8/2002 | Shinasaki | |
| 2002/0135017 A1 | 9/2002 | Vogt et al. | |
| 2002/0137297 A1 | 9/2002 | Kunikiyo | |
| 2002/0142616 A1 | 10/2002 | Giewont et al. | |
| 2002/0171107 A1 * | 11/2002 | Cheng et al. | 257/347 |
| 2003/0038323 A1 | 2/2003 | Kotani | |
| 2003/0042515 A1 | 3/2003 | Xiang et al. | |
| 2003/0045131 A1 | 3/2003 | Verbeke et al. | |
| 2003/0098479 A1 | 5/2003 | Murthy et al. | |
| 2003/0124840 A1 | 7/2003 | Dubin | |
| 2004/0041216 A1 | 3/2004 | Mori et al. | |
| 2004/0053481 A1 | 3/2004 | Chakravarthi et al. | |
| 2004/0118812 A1 | 6/2004 | Watkins et al. | |
| 2004/0119102 A1 | 6/2004 | Chan et al. | |
| 2004/0132291 A1 | 7/2004 | Lee et al. | |
| 2005/0112817 A1 | 5/2005 | Cheng et al. | |
| 2005/0118769 A1 * | 6/2005 | Kammler et al. | 438/303 |
| 2005/0121719 A1 | 6/2005 | Mori | |
| 2005/0124126 A1 | 6/2005 | Wu | |
| 2005/0130434 A1 | 6/2005 | Chien et al. | |
| 2005/0153566 A1 | 7/2005 | Han et al. | |
| 2005/0176205 A1 | 8/2005 | Chien et al. | |
| 2005/0212015 A1 | 9/2005 | Huang et al. | |
| 2005/0252443 A1 | 11/2005 | Tsai et al. | |
| 2006/0014366 A1 | 1/2006 | Currie | |
| 2006/0094215 A1 | 5/2006 | Frohberg et al. | |
| 2006/0099766 A1 | 5/2006 | Jin et al. | |
| 2006/0131648 A1 | 6/2006 | Ahn et al. | |
| 2006/0151776 A1 | 7/2006 | Hatada et al. | |
| 2006/0151840 A1 | 7/2006 | Maekawa | |
| 2006/0154410 A1 * | 7/2006 | Choi et al. | 438/184 |
| 2006/0175686 A1 | 8/2006 | Murata et al. | |
| 2006/0202237 A1 * | 9/2006 | Huang et al. | 257/250 |
| 2006/0252191 A1 | 11/2006 | Kammler et al. | |
| 2006/0281271 A1 | 12/2006 | Brown et al. | |
| 2007/0042602 A1 | 2/2007 | Watkins et al. | |
| 2007/0057324 A1 | 3/2007 | Tews et al. | |
| 2007/0132013 A1 | 6/2007 | Banerjee et al. | |
| 2007/0166937 A1 | 7/2007 | Adetutu et al. | |

OTHER PUBLICATIONS

Actions on the Merits by the U.S.P.T.O. as of Oct. 1, 2007, 6 pages.

Cohen et al., "A Self-Aligned Silicide Process Utilizing ION Implants for Reduced Silicon Consumption And Control of the Silicide Formation Temperature," vol. 716, 2002 Materials Research Society, pp. B1.7.1-B1.7.6, Yorktown Heights, New York.

Ghani et al., "A 90nm High Volume Manufacturing Logic Technology Featuring Novel 45nm Gate Length Strained Silicon CMOS Transistors," 2003 IEEE, 3 pages.

Van Meer et al., "70 nm Fully-Depleted SOI CMOS Using A New Fabrication Scheme: The Spacer/Replacer Scheme," IMEC, Leuven, Belgium.

Nojiri et al. "Bias-Dependent Etching of Silicon In Aqueous Ammonia," Central Engineering Lab. Nissan Motor Co., 1991IEEE, pp. 136-139, Yokosuka, Japan.

Branebjerg et al. "Dopant Selective HF Anodic Etching of Silicon," Mesa-Institute, University of Twente, 1991 IEEE, pp. 221-226, Enschede, The Netherlands.

Wang et al., "Selective Etching of N-Type silicon Using Pulsed Potential Anodization," General Motors Research Lab., 1991 IEEE, pp. 819-822, Warren, Michigan.

van den Meerakker et al., "A Mechanistic tudy of Silicon Etchingin NH3/H202 Cleaning Solutions," Philips Research Lab., J. Electrochem. Soc., vol. 137, No. 4, pp. 1239-1243 Eindhoven The Netherlands.

Besser et al., "Silicides for the 65 nm Technology Node," MRS Symposium Proc. 766, 2003, pp. 1-11.

Wolf et al., "Silicon Processing for the VLSI Era vol. 1: Process Technology", ISBN 0-961672-3-7, University of California, Sunset Beach, California, pp. 521-542, 1986.

Chau et al., "A 50nm Depleted-Substrate CMOS Transistor (DST)," 2001 IEEE, Intel Corporation, Hillsboro, Oregon, pp., 2001.

Actions on the Merits by the U.S.P.T.O. as of Feb. 18, 2008, 7 pages.

Van Zant, Peter, "Microchip Fabrication, A Practical Guide to Semiconductor Processing," Fifth Edition, 2004, pp. vii-xii, 73-96. 98, 100, 103-105, 268, and 495-501.

* cited by examiner

METHOD OF FORMING A SEMICONDUCTOR DEVICE

CROSS-REFERENCE TO RELATED APPLICATION(S)

The present application is a continuation-in-part of U.S. patent application Ser. No. 10/969,774 entitled "DEVICE COMPRISING AN EPITAXIAL LAYER AND METHOD THEREOF", filed on Oct. 20, 2004 now abandoned which is hereby incorporated herein by reference in its entirety, wherein both applications are subject to common assignment. The present application is further related to copending U.S. patent application Ser. No. 10/791,346, entitled "CONTAMINATION REMOVAL PROCESSES DURING SEMICONDUCTOR MANUFACTURING", filed Mar. 2, 2004, which is hereby incorporated herein by reference in its entirety. The present application is further related to copending U.S. patent application, having application Ser. No. 10/969,769 filed on a common date herewith, entitled "METHOD FOR POST OFFSET SPACER CLEAN FOR IMPROVED SELECTIVE EPITAXY SILICON GROWTH", filed Oct. 20, 2004, which is hereby incorporated herein by reference in its entirety. The present application is further related to copending U.S. patent application, having application Ser. No. 10/969,771, entitled "METHOD OF CLEANING A SURFACE OF A SEMICONDUCTOR SUBSTRATE", filed Oct. 20, 2004, which is hereby incorporated herein by reference in its entirety. The present application is further related to copending U.S. patent application, having application Ser. No. 11/076,277, entitled "SEMICONDUCTOR DEVICE AND METHOD OF FORMING", filed Mar. 9, 2005, which is hereby incorporated herein by reference in its entirety. The present application is further related to copending U.S. patent application, having application number.

BACKGROUND

1. Field of the Disclosure

The present disclosure relates generally to a semiconductor manufacturing method and more specifically to the use of sidewall structures in the manufacturing of semiconductor devices.

2. Description of the Related Art

As critical dimensions of semiconductor-based transistors become smaller the effects of surface contamination on various processing stages can become more pronounced. For example, increased junction leakage can occur subsequent to silicidation of an epitaxial layer when the epitaxial layer is disposed upon a rough surface as a result of surface contamination. Therefore, a method of manufacturing overcoming problems such as this would be useful.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements for clarity.

The use of the same reference symbols in different drawings indicates similar or identical items.

DESCRIPTION OF THE PREFERRED EMBODIMENT(S)

In accordance with a specific embodiment of the present disclosure a sidewall spacer structure is formed adjacent to a gate structure whereby a material forming an outer surface of the sidewall spacer structure contains nitrogen. Subsequent to its formation the sidewall spacer structure is annealed to harden the sidewall spacer structure from a subsequent cleaning process. Improved epitaxial regions are realized as a result of hardening the sidewall spacer structure prior to epitaxial formation. The present disclosure will be better understood with respect to FIGS. 1-8.

FIGS. 1 through 9 illustrate, in cross section, a location 10 of a workpiece where a transistor of a semiconductor device is being manufactured according to specific embodiments of the present disclosure. At the manufacturing stage illustrated in FIG. 1, deposition, photolithography, and etch processes have been conducted on location 10 such that a conductive gate structure 14 of the transistor being manufactured has been formed overlying a gate dielectric layer 12 that overlies a substrate 5. Substrate 5 is typically a semiconductor substrate that is a mono-crystalline silicon substrate, a gallium arsenide substrate, a silicon-on-insulator substrate, a silicon-on-sapphire substrate, or the like. The gate dielectric layer 12 is typically an oxide layer physically separating the conductive gate structure 14 from the underlying substrate 5 where a channel location of the transistor being formed resides. The gate dielectric will typically have a thickness in the range of 0.5 to 5 Angstroms.

Figure 1:
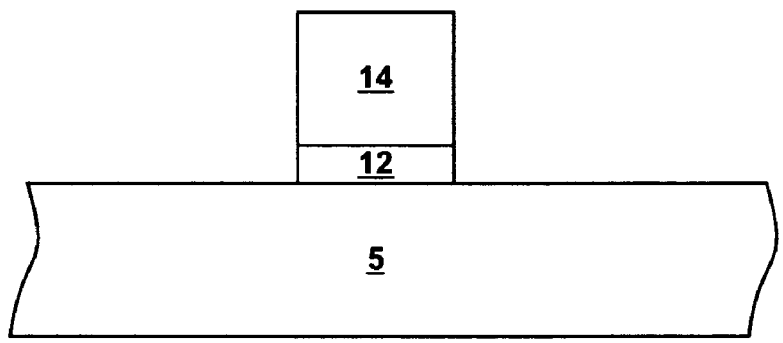
FIGS. 1-9 illustrate cross-sectional views of a substrate location during various processing stages used to form a transistor in accordance with a specific embodiment of the present disclosure.

The conductive gate structure 14 will typically contain polysilicon, though it may contain other materials and multiple layers. Conductive gate structure 14 is illustrated in FIG. 1 to have a left sidewall and a right sidewall substantially parallel to each other, and perpendicular to a planer interface between the gate oxide layer 12 and the substrate 5. A length of the conductive gate structure 14 is the distance between its left and right sidewalls as illustrated in FIG. 1 and will typically be in the range of 10 to 500 nm.

Figure 2:
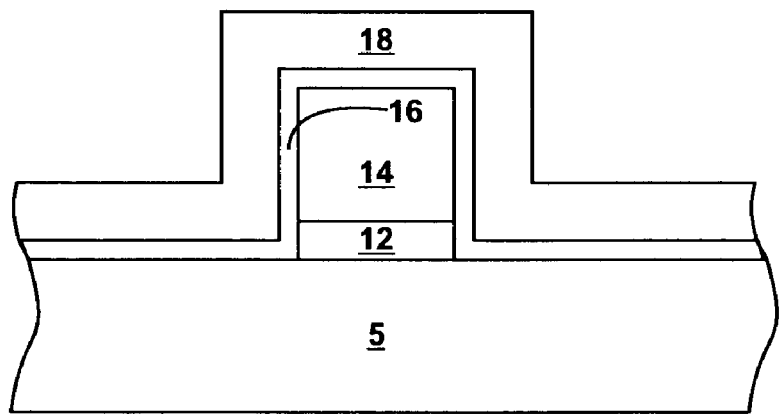

FIGS. 2-7 illustrate a specific embodiment of forming a sidewall spacer structure having two spacers adjacent to conductive gate structure 14. FIG. 2 illustrates location 10 subsequent to forming liner 16 overlying conductive gate structures 14 and a layer 18 overlying layer 16 from which a sidewall offset spacer will be formed. Layer 16 is thinner than layer 18, and is referred to as a liner, or liner layer. Layer 16 is typically a dielectric material such as an oxide, a nitride (i.e., Silicon oxynitride), or polysilicon that protects conductive gate structure 14 and substrate 5 from subsequent processing and need not be present depending upon subsequent processing steps. The material of layer 18 is typically chosen to be selectively etchable relative to the material of layer 16, and is used to create a sidewall spacer referred to as a sidewall offset spacer. In one embodiment, when layer 16 is an oxide, layer 18 will be a nitride, such as a silicon oxynitride; alternately, if liner 16 is a nitride, layer 18 will be an oxide. Materials forming layers 16 and 18 selected such that an etch chemistry that is used to etch layer 18 will etch layer 18 at a faster rate than layer 16.

Figure 3:
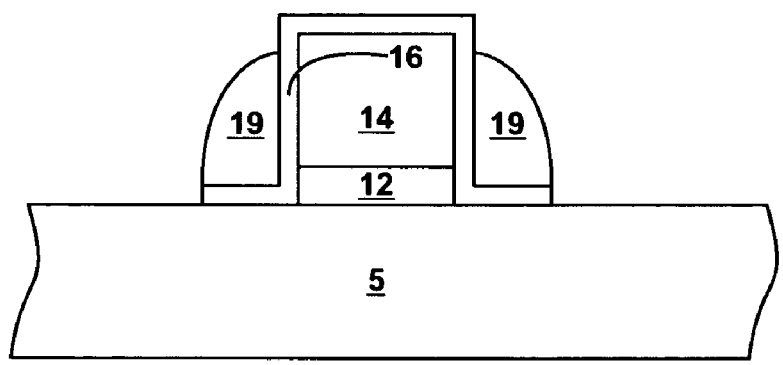

FIG. 3 illustrates location 10 subsequent to etching of layer 18 thereby forming a sidewall offset spacer 19 that is adjacent to conductive gate structure 14. An anisotropic etch is typically used to remove portions of layer 18 not forming sidewall offset spacer 19. The anisotropic etch of layer 18, as illustrated in the embodiment of FIG. 3, results in sidewall offset spacer 19 having a "D" shape, so called because a width of spacer 19 narrows in a non-linear manner at locations further from gate dielectric 12 to provide a profile similar to the top half of the capital letter "D". The etch process that forms sidewall offset spacer 19 illustrated in FIG. 3 selectively etches layer 18 relative to layer 16, thereby leaving layer 16. However, in an alternate embodiment the etch that forms sidewall offset spacer 19 can also remove portions of layer 16, though typically it is desirable to leave layer 16 to protect active silicon regions from exposure to the etch that removes layer 18.

Figure 4:
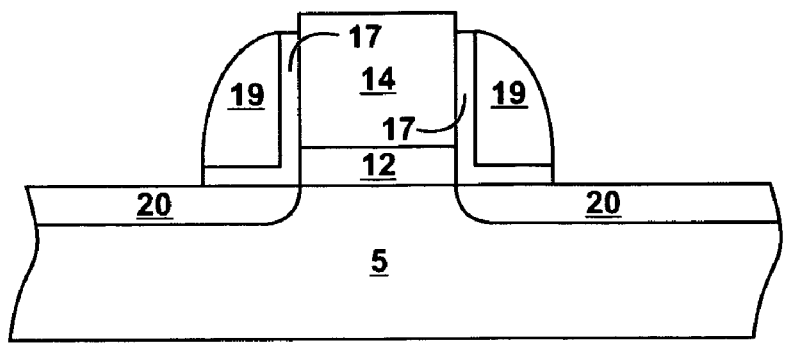

FIG. 4 illustrates location 10 subsequent to etching portions of layer 16, thereby exposing a top portion of conductive gate structure 14 and active silicon at source/drain locations of the transistor being formed, thus leaving sidewall liner 17, which is that portion of layer 16 abutting offset spacer 19 to form a sidewall spacer structure. Conductive gate structure 14, gate dielectric 13, offset spacer 19, and liner 17 are all part of a gate structure at the transistor location. A dopant has been implanted, either prior or subsequent to removal of layer 16, to form a doped region 20 that facilitates formation of a source/drain (S/D) extension region. Doped region 20 will have either an N-type or P-type conductivity depending upon whether an NMOS or PMOS transistor is being formed.

Figure 5:
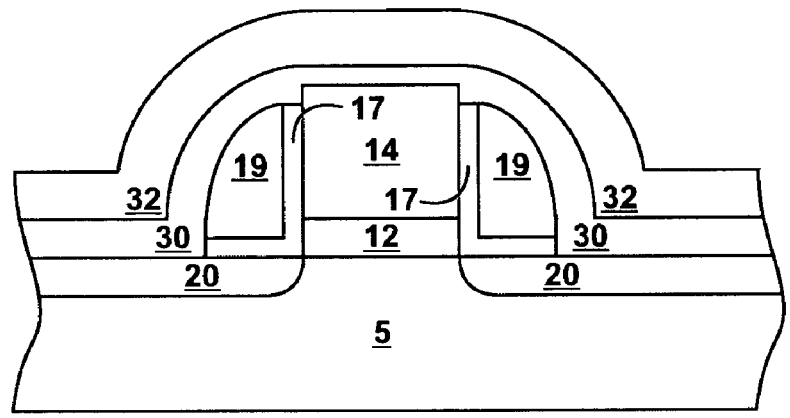

FIG. 5 illustrates location 10 subsequent to disposing a layer 30 overlying the single gate structure of FIG. 4 and a layer 32 overlying layer 30. Layer 30 is typically a liner comprising a dielectric material, such as an oxide or a nitride that protects the previously formed gate structure from subsequent processing, and need not be present depending upon subsequent processing. Layer 32 is typically formed from a material that is selectively etchable relative liner 30, such as an oxide or a nitride, and will be etched to create a second sidewall spacer. In accordance with a specific embodiment of the present disclosure, liner 30 is an oxide and layer 32 is a material containing nitrogen. For example, layer 32 can be a silicon nitride, such as silicon oxynitride.

Figure 6:
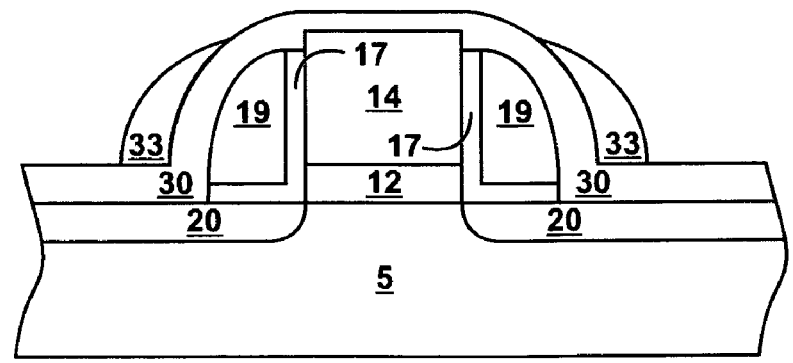
Figure 7:
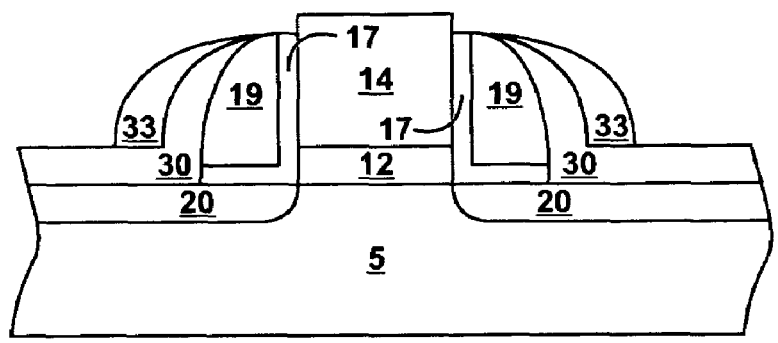

FIG. 6 illustrates location 10 subsequent to etching of layer 32 to form a sidewall spacer 33 that contains Nitrogen. Sidewall spacer 19 is between sidewall spacer 33 and conductive gate 14. An anisotropic etch is typically used to remove portions of layer 32 not forming sidewall spacer 33, thereby forming a sidewall spacer 33 with a "D" shape. A subsequent etch is performed to remove portions of liner 30 to expose a top surface of conductive gate structure 14 and a surface of substrate 5 as illustrated in FIG. 7. This subsequent etch leaves a portion 31 of layer 30 as part of a sidewall spacer structure that includes spacer 33.

Figure 8:
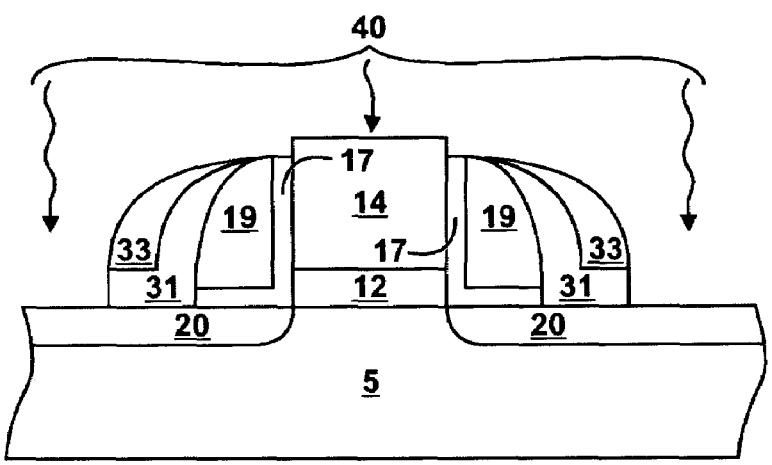

FIG. 8 illustrates a sidewall spacer structure that includes both sidewall spacers 19 and 33 being exposed to an anneal 40 to harden the nitrogen containing spacer 33 from subsequent cleaning processes. In one embodiment, the anneal 40 is a rapid thermal anneal (RTA) that spikes at a maximum temperature without holding the temperature for a substantial amount of time. For example, the RTA typically will reach a temperature in the range of 400-1200° C. in less than approximately 40 seconds. In one embodiment, an anneal temperature of 850-1000° C. and a time of 1-10 seconds. Other temperature ranges for the RTA include 950-1050° C. While anneal 40 has been found to be advantageous, in other embodiments it can be omitted.

In one embodiment, location 10 is exposed to a solution containing HF, after anneal 40 followed by forming an epitaxial layer 42 at source/drain locations of the transistor being formed. After the epitaxial layer is formed dopants are implanted to form doped regions 46 that facilitate formation of deep source/drain regions of the transistor location. The HF containing solution can include an aqueous solution of deionized water and hydrofluoric acid (HF or hydrogen fluoride in water) aqueous solution of approximately 30:1 (volumetric ratio) at 21 degrees Celsius, for a time period ranging from between 50-60 seconds. The weight percentage of HF recommended for the HF aqueous solution is 49% in a balance of deionized water ($H_2O$). Bulk HF aqueous solution can be purchased from various chemical suppliers in the HF weight percent range of 10% to 49%. In semiconductor fabrication facilities, this aqueous HF aqueous solution is typically diluted in the range 10:1 to 200:1. A 10:1 HF is 1 part aqueous HF (at 49% weight percent) and 10 parts $H_2O$. The thickness of the epitaxial layer depends upon device requirements, but typically has a thickness in the range of 30-300 nm, and more typically in the range of 30-100 nm. Dopants implanted to form regions 46 will include P-Type or N-Type dopants based upon whether a NMOS or PMOS transistor is being formed.

Figure 9:
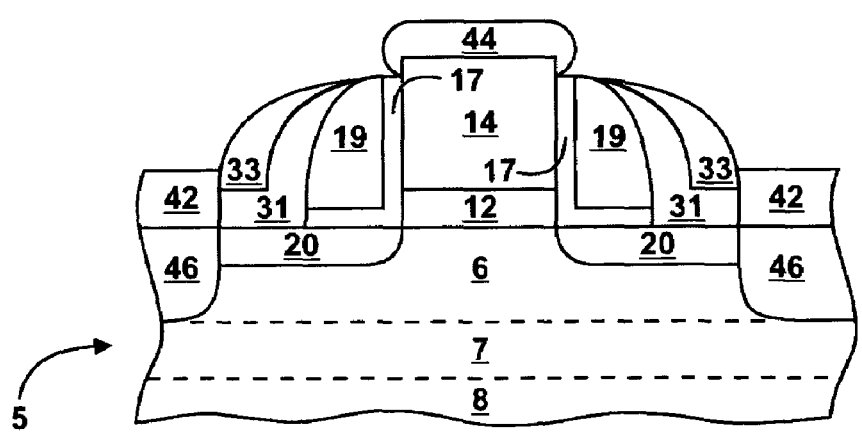

In an alternate embodiment location 10 is implanted with dopants at source/drain locations of the transistor location prior to the anneal 40, and the location 10 is exposed to a solution containing HF subsequent to anneal 40 and prior to formation of an epitaxial layer. FIG. 9 illustrates location 10 after formation of the epitaxial layer 42 at source/drain active regions of transistor being formed (i.e., abutting the source/drain region). Note that in the particular embodiment an epitaxial layer 44 is also formed overlying conductive gate structure 14. In a typical embodiment, epitaxial layers 42 and 44 are exposed to a silicidation process to form silicide layers. It will be appreciated that the locations of the epitaxial layers 42 are defined by the outer surfaces of the sidewall gate structure to which they abut as well as by structures, i.e., isolation regions, not illustrated in the figures.

FIG. 9 further illustrates semiconductor substrate 5 comprising a semiconductor-on-insulator (SOI) substrate, where layer 6 represents a semiconductor layer, such as silicon, overlying an insulator region layer 7, such as an oxide, and layer 7 overlying layer 8, which is a support substrate, which can also be a semiconductor material, such as silicon.

Figure 10:
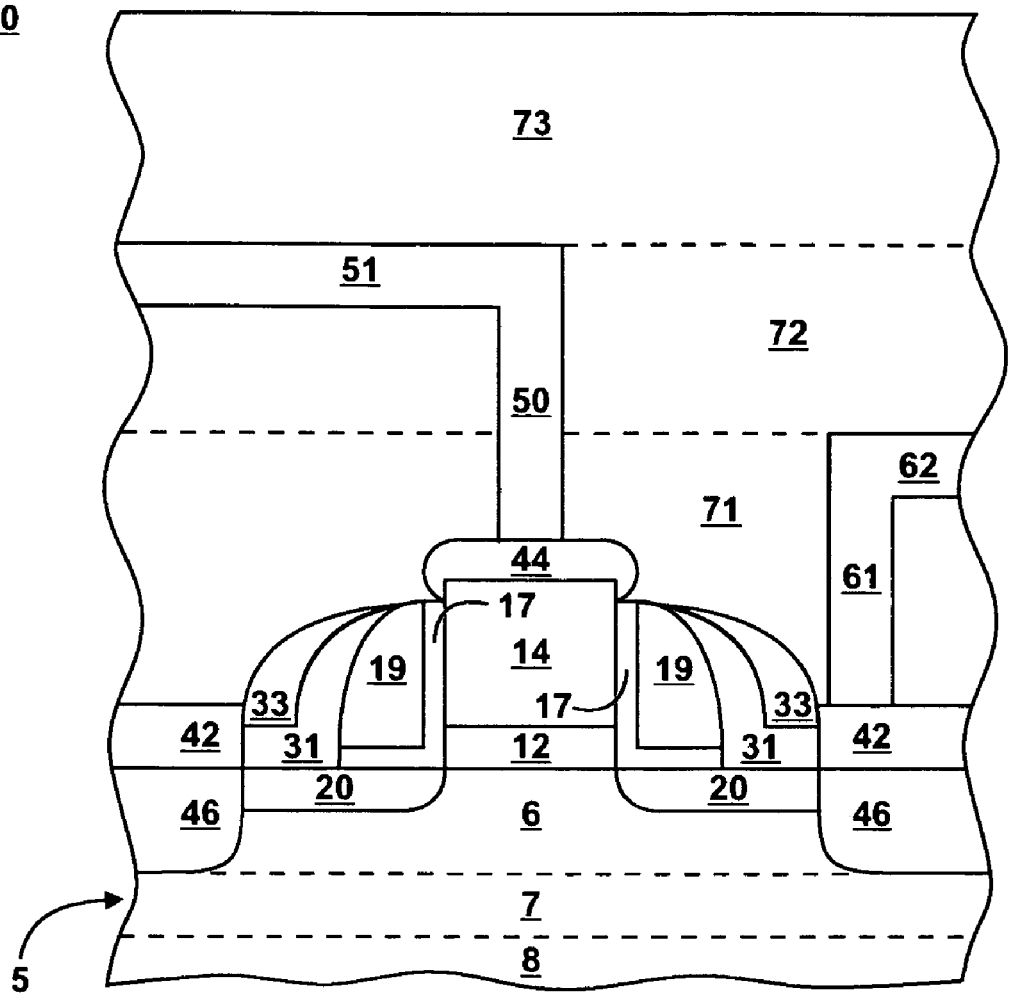
FIG. 10 illustrates a portion of a device formed using the methods described in accordance with a specific embodiment of the present disclosure.

FIG. 10 illustrates location 11 after completion of device processing. Specifically, FIG. 11 includes dielectric layers 71, 72 and 73. Contacts and vias, such as 61 and 50, are formed through the layers 71 and 72 to contact structures at lower levels. Dielectric layer 73 is an upper most protective layer of the completed device, and is commonly referred to as a passivation layer. A first metal layer includes metal trace 62; a second metal layer includes conductive trace 51.

The method described herein provides for a flexible implementation. Although the disclosure has been described using certain specific examples, it will be apparent to those skilled in the art that the invention is not limited to these few examples. Fore example, various types of deposition and etch techniques are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art.

For example, it will be appreciated that any number of substrate preclean steps can occur before the formation of any epitaxial layer. For example, United States patent application having Ser. No. 10/791,346, which is hereby incorporated in its entirety by reference, discloses several substrate preclean techniques appropriate for cleaning a substrate prior to forming an epitaxial layer.

In one example, contaminates on the surface of a substrate are subjected to a cleaning process comprising applying a plasma to a surface of the active regions produce a reduction reaction with the contaminates in an upper portion of the surface of the active regions. In an embodiment, the plasma comprises $H_2$. While the plasma is being applied to the upper portion of the exposed active regions, the resultant products or vapor byproducts of the reduction reaction are removed by the normal vacuum process within the chamber. Therefore, contaminates contained in the vapor byproducts and are vented away, leaving the upper portion of the surface of the active regions suitably clean for the ensuing epitaxial process. In one embodiment, the plasma process parameters comprise a gas flow of 450 sccm H2 and 300 sccm argon, at a chamber temperature of 400 degrees Celsius, with a high frequency (HF) power setting of 700 W, and a low frequency (LF) power setting of between approximately 50 to 100 W. Chamber pressure is 1 Torr, and the spacing between the surface of the active region and the faceplate of the tool (not shown) should be 300 mils. In other embodiments, plasma process parameters comprise a gas flow ranging from between 100-800 sccm $H_2$ and from between 100 and 600 sccm argon. Chamber temperatures can range between 300 to 450 degrees Celsius, and HF power settings from between 400-900 W, with LF power settings varying from between 0-150 W. Chamber pressures can range from between 1 mT-5 Torr, with spacing between the surface of the active region and the faceplate of the tool varying from between 200 to 400 mils. Exposure times for the various embodiments utilizing plasma range from between approximately 10 seconds up to approximately 120 seconds.

Various tool types are suitable for this cleaning, for example, CVD (Chemical Vapor Deposition) equipment, HDP (High Density Plasma) tools, etch chambers, or the like. Differences in chamber design, power settings, and species, e.g., $H_2$ with or $H_2$ without helium or nitrogen, will result in different thickness of the layer after anneal. Typically the layer after anneal will be between 20 and 50 Angstroms thick. This plasma cleaning process also results in passivation of Si—H bonds in the layer after anneal. No wet cleaning dip with hydrofluoric (HF) acid prior to SEG is necessary.

In addition to no longer requiring an HF dip prior to SEG, the reduced temperature of this $H_2$ plasma cleaning treatment results in a reduction of the SEG process thermal budget of more than 100 degrees Celsius. Typically pre-SEG cleaning processes are conducted at approximately 900 degrees Celsius or greater. In an embodiment of the present disclosure, the cleaning process occurs at less than approximately 800 degrees Celsius. In another embodiment, the cleaning process occurs at less than approximately 500 degrees Celsius or less. In addition, the cleaning processes of the present disclosure could be conducted at less than approximately 700 degrees Celsius or less, or even at less than approximately 600 degrees Celsius or less.

In another embodiment, location including includes a gate structure and active regions is subjected to a cleaning process utilizing a low-power dry etch to selectively remove an upper atomic layer of material from the active regions. The thickness of the upper atomic layer of material to be removed ranges from between 20 to about 50 Angstroms. In one embodiment, the dry etch process is an anisotropic dry etch utilizing a carbon-free gas as an etchant gas. In another embodiment, the anisotropic dry etch utilizes an oxygen- and carbon-free gas as an etchant gas. The etchant gas can comprise HBr, $NF_3$, $SF_6$, gaseous fluorine-interhalogenics such as $ClF_3$, or any gas containing fluorine, suitable to disassociate F-radicals, which does not contain oxygen and carbon. Prior to undergoing the anisotropic dry etch process, location 200 is subjected to a standard wet etch chemistry process utilizing a dilute HF solution (100:1) at room temperature, e.g., 20 to 26 degrees Celsius, for a time period ranging from 50 to 200 seconds. Following the HF clean, a low-power dry etch utilizing a temperature of approximately 400 degrees Celsius, RF power of approximately 375 W, pressure of approximately 150 mTorr, and a gas flow rate ranging from 50 to 100 sccm, is conducted. In other embodiments, the low-power dry etch utilizes a temperature ranging from between 300-500 degrees Celsius, with RF power ranging from between 200-700 W, a pressure ranging between 0-1 Torr, and a gas flow rate ranging from between 10-300 sccm, for a time ranging between 10 to 60 seconds.

This low-power dry etch removes carbon and oxygen contamination, and provides a very clean surface for SEG. The low temperature HF clean followed by the low-power dry etch does not require a high temperature bake. This results in a reduction of thermal budget for SEG of more than 100 degrees Celsius.

In another embodiment, a cleaning process is used that forms an oxidation layer of between 20 to 50 Angstroms on an upper surface of the active regions using a plasma to produce the oxidation layer on doped active regions. In an embodiment, the plasma is an $O_2$ plasma. In another embodiment, the plasma is an $O_3$ plasma.

An $O_2$ plasma production utilizes $O_2$ gas at a flow rate of 400 sccm, a pressure of 5 Torr, an HF of 300 W, an LF of 100 W, and a temperature of 400 degrees Celsius, with the time ranging from between about 10 to about 120 seconds. The spacing between the surface of the active regions and the faceplate of the vapor deposition apparatus (not shown) should be 400 mils. In other embodiments, the plasma production utilizes $O_2$ gas at a flow rate of between 100 and 1000 sccm, a pressure ranging from between 2-10 Torr, an HF ranging between 200-500 W, an LF ranging between 50-200 W, a temperature ranging between 300-450 degrees Celsius, for a time ranging from between approximately 10 to approximately 120 seconds. In an embodiment, the spacing between the surface of the active regions and the faceplate of the vapor deposition apparatus ranges from between 200 and 600 mils. The tool type used to generate the plasma could be CVD equipment, HDP tools, or etch chambers. In an embodiment where the plasma is $O_3$, plasma production utilizes $O_3$ gas at a flow rate of 300 sccm, a pressure of 5 Torr, an HF of 300 W, an LF of 100 W, and a temperature of 400 degrees Celsius for a time period ranging from between 10 to 120 seconds. The spacing between the surface of the active regions and the face plate of the vapor deposition apparatus (not shown) should be 400 mils. In other embodiments, plasma production utilizes $O_3$ gas at a flow rate of between 50 and 600 sccm, a pressure ranging from between 2-10 Torr, an HF ranging between 200-500 W, an LF ranging between 50-200 W, and a temperature ranging from between 300-450 degrees Celsius for a time period ranging from between about 10 to about 120 seconds. In an embodiment, the spacing between the surface of the active regions and the faceplate of the vapor deposition apparatus ranges from between 200 and 600 mils. As was the case with the $O_2$ plasma, the tool type used to generate the plasma could be HDP tools, CVD equipment, or etch chambers.

Forming the oxidation layer facilitates trapping or fixing contamination in the oxide layer overlying the upper layer of the doped active regions for subsequent removal using a wet chemistry process. The wet etch chemistry process utilizes a dilute HF acid solution of 100:1 at room temperature, e.g. 20 to 26 degrees Celsius, for a time ranging from 50 to 200 seconds. Differences in chamber design, power settings and species employed, e.g., $O_2$ or $O_3$ results in differing thickness of the oxidation layer, hence the wide range in times for the HF dip. The use of an $O_2$ or $O_3$ plasma to create a contamination-trapping oxidation layer for removal by a room temperature HF dip results in a reduction of the thermal input for location 300.

Another possible pre-clean, different from the one described above, prior to formation of an SEG that facilitates a reduced temperature $H_2$ bake is performed following formation of any desired spacers, which can comprise one or more nitride or oxide layers and prior to SEG formation. This pre-clean and comprises a first pre-rinse with deionized water, followed by an oxide etch utilizing an aqueous solution of deionized water and hydrofluoric acid (HF or hydrogen fluoride in water) aqueous solution of approximately 30:1 (volumetric ratio) at 21 degrees Celsius, for a time period ranging from between 50-60 seconds. The weight percentage of HF recommended for the HF aqueous solution is 49% in a balance of deionized water ($H_2O$). Bulk HF aqueous solution can be purchased from various chemical suppliers in the HF weight percent range of 10% to 49%. In semiconductor fabrication facilities, this aqueous HF aqueous solution is typically diluted in the range 10:1 to 200:1. A 10:1 HF is 1 part aqueous HF (at 49% weight percent) and 10 parts $H_2O$. It will be appreciated that the etch rate of the HF aqueous solution is substantially linear with respect to both the concentration of the HF aqueous solution and the etch time. Therefore, various combinations of HF concentrations and etch times can be used to accomplish the oxide etch. Additionally, the temperature may vary.

After the HF etch, an overflow rinse utilizing deionized water is performed for a period ranging from approximately 120 to 600 seconds with a typical rinse being about 400 seconds. The cleaning process of portion 100 results in etching away of the surface contamination/debris located on substrate 10 resulting from offset spacer formation and/or dopant implantation. The upper semiconductor surface, i.e. silicon surface, of substrate 10 is also slightly etched, for example, from one to several mono layers of silicon, during the HF etch.

It should be noted that the amount of material removed during the HF etch is dependent upon the type of material being removed. For example, when native oxide is present, the HF etch will remove approximately 20 to 30 Angstroms of oxide. If a deposited oxide layer is present in addition to a native oxide, an over-etch of approximately 30% is generally desirable. For example, if removal of 100 Angstroms of a chemical vapor deposition (CVD) oxide is desired, the HF etch could be employed to remove approximately 120 to 130 Angstroms oxide removal. This latter example would be applicable in applications where a liner oxide of approximately 100 Angstroms thickness is employed between a conductive gate 25 and a nitride spacer.

The next steps in the cleaning process comprise a second pre-rinse with deionized water of approximately 30 seconds duration precedes the performance of a Standard Clean-1 (SC-1), a quick dry rinse (QDR), and a Standard Clean-2 (SC-2). The SC-1 and SC-2 components are followed by a second QDR, and an HF: $H_2O$ etch, a third rinse, and an isopropyl alcohol (IPA) dry. The amount of material removed by the SC-1 and SC-2 components are implemented such that they etch from approximately one monolayer of silicon to approximately 10 to 100 Angstroms of silicon.

In an embodiment, the SC-1 utilizes an aqueous solution of ammonium hydroxide: hydrogen peroxide: deionized water at a ratio of approximately 1:14:640, at a temperature of approximately 60 degrees Celsius for approximately 72 minutes, to etch approximately 100 Angstroms of silicon. Synonyms for ammonium hydroxide ($NH_4OH$) include ammonia solution (typically contains between 12% and 44% ammonia before dilution), dilute ammonia, or concentrated ammonia. A first quick dry rinse is conducted for approximately 3 minutes. In an embodiment, the SC-2 utilizes a solution of hydrochloric acid: hydrogen peroxide: deionized water at an initial ratio of approximately 1:1:50 at a temperature of approximately 60 degrees for about 5 minutes. A second quick dry rinse is then conducted. Synonyms for hydrochloric acid (HCl) are hydrogen chloride, anhydrous hydrogen chloride, aqueous hydrogen chloride, chlorohydric acid, spirit of salts, and muriatic acid.

In a particular embodiment, the SC-1 utilizes a solution of ammonium hydroxide: hydrogen peroxide: deionized water at a ratio of approximately 1:4:20 at a temperature ranging of approximately 60 degrees Celsius for approximately 72 minutes. The SC-1 is the step in the clean sequence that etches the silicon. This occurs because the $H_2O_2$ (the oxidizer) becomes depleted in the solution with increasing time and increasing temperature. The methods of the present disclosure allow the initial concentration of hydrogen peroxide to be depleted to facilitate etching of the upper-most semiconductor portion. Depletion of the $H_2O_2$ is greatly enhanced when the solution temperature rises above 80 degrees Celsius, which can lead to an etch that is difficult to control if not carefully monitored. The temperature range of the SC-1 is expected to be approximately 55 to 85 degrees Celsius, with the etch occurring in a shorter period of time at higher temperatures than at lower temperatures. It is expected that the SC-1 etching will be better controlled at temperatures in the range of 55-80 degrees Celsius and better still at temperatures in the range of 55-75 degrees Celsius. Generally, it is expected that the substrate will be exposed to the SC-1 etch process for longer that 60 minutes. When the oxidizer stops protecting the silicon surface, the ammonium hydroxide ($NH_4OH$) starts to etch the silicon. Thus, a small amount of silicon can be etched in a controlled manner. The SC-1 can be performed in a re-usable bath where the solution is re-circulated and heated to maintain the desired temperature.

The mechanism of silicon and $SiO_2$ etching by a $NH_4OH/H_2O_2$ solution occurs when the solution is allowed to be depleted of $H_2O_2$. An alkaline solution, such as NH4OH4 in our example, will attack silicon by water molecules, according to the reaction:

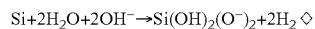

$$Si + 2H_2O + 2OH^- \rightarrow Si(OH)_2(O^-)_2 + 2H_2 \diamond$$

A passivation layer formed by the $H_2O_2$ prevents this attack by the $NH_4OH$. $H_2O_2$ decomposes in the course to form $O_2$ and $H_2O$.

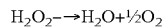

$$H_2O_2 \rightarrow H_2O + \tfrac{1}{2}O_2$$

When the concentration of $H_2O_2$ is below $3 \times 10^{-3}$ M, then silicon will begin to etch, because of the absence of the inhibition layer.

As indicated in the above equations, heat is given off as the $H_2O_2$ is depleted. If a bath is used that is not recharged with fresh solution all $H_2O_2$ will be depleted, thereby no longer releasing heat. Therefore, the temperature can be monitored on the low end to indicate when the solution should be refreshed, while the temperature on the high end is monitored to prevent unusually rapid decomposition of the $H_2O_2$, which can lead to a process that is difficult to control.

The first quick dry rinse is conducted for approximately 3 minutes. The subsequent SC-2 utilizes a solution of hydrochloric acid: hydrogen peroxide: deionized water at a ratio of approximately 1:1:50 at a temperature of approximately 60 degrees for about 5 minutes. A quick dry rinse with deionized water, followed by an IPA dry process, is performed following the SC-2.

The IPA dry process uses a heated IPA vapor at approximately 82 degrees Celsius. The IPA vapor is generated in a separate chamber with 100% $N_2$ bubbled through 100% IPA (heated to 82 degrees Celsius). The IPA condenses on the wafer, and the solution drips off the bottom of the wafer. The IPA vapor concentration is slowly diluted to 100% $N_2$ before the wafers are removed from the rinsing/drying tank.

Subsequent to the SC-1 and SC-2 processes, the substrate will be further recessed (etched) as a result of the cleaning process. Next, an HF: H2O etch can be conducted at an aqueous solution ratio of 200:1 for about 65 seconds, which typically results in approximately 30 Angstroms of oxide removal. The HF: H2O etch 8 is followed by a rinse with deionized water for approximately 10 minutes duration. The deionized water rinse is followed by an IPA dry as described in the preceding paragraph. At this time, the source/drain regions of the substrate are ready for ion implantation or selective epitaxial growth.

In a particular embodiment, the SC-1 process comprises a pre-rinse with deionized water of approximately 30 seconds duration. The pre-rinse is followed by a SC-1 solution at a ratio of approximately 1:1-4:6-40, which includes the sub-ranges of 0.25:1:5, 0.5:1:5, 1:1:5, 1:1:6, 1:4:20, and 1:1:40, ammonium hydroxide: hydrogen peroxide: deionized water at a temperature of approximately 60 degrees Celsius for approximately 5 minutes. A quick dump rinse (QDR) is then performed for approximately 3 minutes.

Following the SC-1 cleaning process, an SC-2 cleaning process is performed. In an embodiment, the SC-2 cleaning process includes utilizing an aqueous solution of hydrochloric acid: hydrogen peroxide: deionized water at a ratio of approximately 1:1:50 at a temperature of approximately 60 degrees Celsius for approximately 5 minutes. A QDR is then performed, and portion 200 is ready for the third cleaning. The weight percent composition of the hydrochloric acid: hydrogen peroxide: deionized water is 29% (weight percent) hydrochloric acid and 30% (weight percent) hydrogen peroxide in a balance of deionized water.

After the SC-1 and SC-2, a third cleaning process comprising an approximate 30 second pre-rinse, an oxide etch, an overflow rinse and an IP dry is performed. The oxide etch is accomplished utilizing a solution of deionized water and hydrofluoric acid at a ratio of approximately 200:1 for a time period ranging from between 450-650 seconds. Following the HF etch, an overflow rinse is performed for approximately 10 minutes. A final isopropyl alcohol (IPA) dry is then performed. Approximately 120-140 Angstroms of the surface of substrate 20 is removed in this process. Portion 200 is ready to undergo selective epitaxial growth.

The above-described cleaning process has been found to facilitate formation of an epitaxial layer on a semiconductor surface, specifically silicon. Because various etch processes can etch N- and P-type regions at different rates, it can be useful to amorphize an upper-most surface of the source/drain regions prior to the above-described clean to reduce any preferential etch differences between substrate regions of differing dopant types.

For example, the above-described clean process can etch the N-type silicon preferentially, as compared to the P-type silicon, resulting in a quality difference of the SEG between the N and P regions after SEG processing. Etch rate differences between N- and P-type regions can allow for contaminates to remain in the lesser-etched region. For example, an etch process that does not etch P-type regions at the same rate as N-type regions can result in P-regions maintaining embedded carbon that is incorporated from previous process steps. Without appropriate etching of silicon in the P-type regions during the clean, the carbon will remain, and the SEG will grow inconsistently. A high bake temperature of 900° C. can be used to overcome this growth issue on P areas, however, as stated previously, high bake temperatures can be detrimental to the device in that it causes diffusion and deactivation of the dopants. Amorphizing the source/drain regions can reduce etch differences associated with the above-described cleaning process as well as other processes that are used to etch doped substrate regions, thereby improving the quality of both the N and P regions.

It has been observed that the selective etching may be P-type over N-type, or N-type over P-type depending on the solution temperature, flow rate of the aqueous ammonia, concentration of the aqueous ammonia, agitation, or illumination of light. By amorphizing the silicon in this manner to a pre-defined depth, it has been observed that unbiased etching to the depth of the amorphized silicon can be achieved.

In one embodiment, N- and P-type extensions formed in the source/drain regions are amorphized by being implanted with the Xe, at a dose of 2E14 and energy of 10 keV, to create an amorphous depth of 100 A.

In accordance with another embodiment, a spacer structure having an undercut can be used to reduce or inhibit facet formation during a selective epitaxial growth process. Such a process can allow for greater lateral uniformity of junction or silicide features during implantation or silicidation processes, and can be accomplished by using a spacer formed with a bi-layer of materials, e.g., a thin liner, such as portion 29 of FIG. 1, of one material underlying another layer of material from which the 'main' spacer is formed. The thin liner and other material layer are selected such that the two materials are selectively etchable with respect to the other, for example, a thin oxide liner and a nitride layer. By etching the underlying portion of the spacer, an undercut can be formed that reduces facets during epitaxial formation.

In addition, a number of etch chemistries can be used to form nitride spacers. These etch chemistries are known in the art, and include the use of gas mixtures such as NF3/HBr, CF4/HBr, SF6/HBr, or any combination of these gases. In an embodiment, helium or argon can be included in the gas mixture to dilute the etch chemistry.

To improve the selectivity of the nitride etch over oxide, oxygen ($O_2$) can be added to the gas mixture flowing into the plasma reactor during etch. In an embodiment, the addition of oxygen during the etching process is an amount between 2 percent and 15 percent by volume. The plasma reactor may be of any type which provides ion bombardment, e.g., capacitively-coupled parallel-plate reactor, or inductively coupled plasma with wafer (RF) bias. The wall temperature of the plasma reactor during etching is between 20 degrees C. and 60 degrees C., while the wafer platen (chuck) temperature is between 50 degrees C. and 80 degrees C. The gas mixture has a total gas flow during etching of between 75 sccm and 150 sccm for 200 mm wafers. The total gas flow would require an increase for 300 mm wafers, in order to compensate for the increase in the plasma reactor chamber volume. The chamber pressure is in the range of 50-150 mtorr for 200 mm wafers using capacitively coupled plasma reactor systems. It should be noted that the chamber pressure necessarily depends upon the size of the chamber, as well as the manufacturer of the plasma reactor equipment. The examples presented herein reference Applied Material's MERIE (magnetically enhanced reactive ion etch) systems.

The amount of oxygen added is dependant upon the particular etch chemistry chosen. An exemplary etch chemistry could be CF4, HBr, and He—O2, with gas flow ratios, by volume, of CF4: HBr: He—O2 of approximately 10: (2-6): (1-6). The ratio of He—O2 used is 70/30 percent by volume, however, other appropriate ratios would work as well. In an embodiment, addition of oxygen during the etching process is an amount between 2% and 15% by volume. The addition of oxygen does not greatly alter the resultant spacer 16 profile, although small alterations are possible. This could, however, be compensated for by changing (i.e., increasing or decreasing) the thickness of nitride layer. Hence the addition of oxygen during the etching process does not require adjustments of other etch process parameters. The addition of oxygen enhances the etch selectivity of the nitride layer 14 to the liner oxide layer 15. In an embodiment, the etch selectivity for silicon nitride is between 1:2 and 1:3.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method of manufacturing a semiconductor device, the method comprising:
   forming a sidewall spacer structure adjacent to a sidewall of a conductive gate structure overlying a semiconductor substrate at a transistor location, wherein the sidewall spacer structure comprises a first offset spacer containing nitrogen and a second offset spacer between the first offset spacer and the conductive gate structure, the first offset spacer defining an outer surface of the sidewall spacer structure;
   implanting a source/drain extension dopant at a source/drain location of the transistor location subsequent to formation of the second offset spacer and prior to formation of the first offset spacer; and
   forming an epitaxial layer at a source/drain location of the transistor location, the epitaxial layer abutting the outer surface of the sidewall spacer structure.

2. The method of claim 1 wherein forming the sidewall spacer structure comprises a first sidewall liner underlying and abutting the first offset spacer.

3. The method of claim 2 wherein forming the sidewall spacer structure comprises removing a portion of a first layer to form the first offset spacer; wherein the portion of the first layer is removed using an etch process that selectively removes the first layer relative to a second layer from which the first sidewall liner is formed.

4. The method of claim 3 wherein the second layer contains an oxide.

5. The method of claim 4 wherein the second layer contains silicon oxide.

6. The method of claim 4 wherein the first layer contains a silicon oxynitride.

7. The method of claim 3 wherein the first layer contains silicon oxynitride.

8. A method comprising:
   forming at a transistor location of a semiconductor substrate a conductive gate structure overlying the semiconductor substrate;
   forming a first layer overlying the conductive gate structure;
   forming a second layer overlying the first layer;
   removing a portion of the second layer to form an offset spacer from the second layer, the offset spacer adjacent the conductive gate structure, wherein a portion of the first layer underlying the portion of the second layer substantially remains after removal of the portion of the second layer;
   implanting a source/drain dopant at a source/drain extension location of the transistor location subsequent to formation of the offset spacer from the second layer;
   forming a third layer containing nitrogen overlying the offset spacer;
   removing a portion of the third layer to form an offset spacer from the third layer;
   forming an epitaxial layer abutting a source/drain active region of the transistor location and abutting the outer surface of the offset spacer from the third layer spacer.

9. The method of claim 8 further comprising:
   removing a portion of the first layer to form a liner layer.

10. The method of claim 9 wherein removing the portion of the second layer to form the offset spacer from the second layer comprises removing the portion of the second layer using an etch process that selectively removes the second layer relative to the first layer from which the liner layer is formed.

11. The method of claim 10 wherein the first layer contains an oxide.

12. The method of claim 10 wherein the second layer contains silicon oxynitride.

13. The method of claim 10 further comprising:
   implanting the source/drain dopant at a source/drain location of the transistor location subsequent to formation of the offset spacer from the third layer.

14. The method of claim 10 further comprising:
   forming an epitaxial layer overlying the conductive gate structure simultaneous with forming the epitaxial layer abutting the source/drain active region of the transistor location.

15. The method of claim 10 further comprising:
   forming a silicide at the epitaxial layer abutting the source/drain active region of the transistor location.

16. The method of claim 1 further comprising:
   implanting the source/drain dopant extension at the source/drain location of the transistor location subsequent to formation of the first offset spacer.

17. The method of claim 16 further comprising:
   forming an epitaxial layer overlying the conductive gate structure simultaneous with forming the epitaxial layer at the source/drain location.

18. The method of claim 17 further comprising:
   forming a silicide at the epitaxial layer at the source/drain location.

19. The method of claim 1 further comprising:
   forming an epitaxial layer overlying the conductive gate structure simultaneous with forming the epitaxial layer at the source/drain location.

20. The method of claim 19 further comprising:
   forming a silicide at the epitaxial layer at the source/drain location.

21. The method of claim 1 further comprising:
   forming a silicide at the epitaxial layer at the source/drain location.

* * * * *

UNITED STATES PATENT AND TRADEMARK OFFICE
CERTIFICATE OF CORRECTION

| | |
|---|---|
| PATENT NO. | : 7,456,062 B1 |
| APPLICATION NO. | : 11/209871 |
| DATED | : November 25, 2008 |
| INVENTOR(S) | : William G. En et al. |

It is certified that error appears in the above-identified patent and that said Letters Patent is hereby corrected as shown below:

Column 1, line 35, please change "application number." to -- application number 11/229,864. --

Column 8, lines 47-48, please change "$Si + 2H_2O + 2OH^- \rightarrow Si(OH)_2(O^-)_2 + 2H_2 \lozenge$" to -- $Si + 2H_2O + 2OH^- \rightarrow Si(OH)_2(O^-)_2 + 2H_2\uparrow$ --

Column 10, line 65, please change "He-----O2" to -- He-O2 --

Column 10, line 66, please change "He-----O2" to -- He-O2 --

Column 10, line 67, please change "He-----O2" to -- He-O2 --

Signed and Sealed this

Tenth Day of November, 2009

David J. Kappos
*Director of the United States Patent and Trademark Office*